(12) United States Patent
Marshall et al.

(10) Patent No.: US 6,268,760 B1
(45) Date of Patent: Jul. 31, 2001

(54) HYSTERETIC FUSE CONTROL CIRCUIT WITH SERIAL INTERFACE FUSING

(75) Inventors: Andrew Marshall, Dallas; Travis Summerlin, Parker, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/302,130

(22) Filed: Apr. 29, 1999

Related U.S. Application Data

(60) Provisional application No. 60/083,590, filed on Apr. 30, 1998.

(51) Int. Cl.[7] .................................................. H01H 37/76
(52) U.S. Cl. ............................................. 327/525; 365/96
(58) Field of Search ........................ 327/525, 96, 225.7; 340/638, 639; 365/200, 96

(56) References Cited

U.S. PATENT DOCUMENTS

| | | | |
|---|---|---|---|
| 5,442,589 | * | 8/1995 | Kowalski .......................... 365/225.7 |
| 5,579,266 | | 11/1996 | Tahara ................................. 365/200 |
| 5,731,760 | * | 3/1998 | Ramirez ............................... 340/638 |

* cited by examiner

*Primary Examiner*—Tuan T. Lam
*Assistant Examiner*—Hiep Nguyen
(74) *Attorney, Agent, or Firm*—Wade James Brady, III; Frederick J. Telecky, Jr.

(57) ABSTRACT

A fuse status detection and serial interface programming circuit which provides a current-free method of detecting a fused/non-fused state of a fuse, and which also prevents filament regrowth. The circuit employs an output inverter to monitor the status of the fuse, and switching transistors to initially blow the fuse, and automatically reblow the fuse if filament regrowth appears.

18 Claims, 6 Drawing Sheets

HYSTERETIC FUSE CONTROL CIRCUIT WITH SERIAL INTERFACE FUSING

This application claims benefit of provisional Appln 60/083,590 filed Apr. 30, 1998.

BACKGROUND AND SUMMARY OF THE INVENTION

The present invention relates to integrated fusible link status detection methods.

BACKGROUND: POLYSILICON FUSE PROGRAMMING CIRCUITS

Polysilicon fuses form one of several structures used as a nonvolatile trim for analog and digital circuits. Previously, polysilicon fuse circuits have taken a form typically as shown in FIG. 4, where a small current source 400 (typically 1 microampere) and threshold detector (e.g. comparator 402) have been used to detect whether a fuse F1 is intact or blown. This method has the disadvantages of: (1) requiring a continuous current flow (for an unblown fuse), and (2) allowing the fuse to appear as unblown if even a small amount of regrowth occurs.

In a typical case of a circuit employing a 1 microampere current source and 1 V threshold detection, any resistance value less than approximately 1 megohm will appear to be a good fuse. The typical resistance of an unblown integrated fuse is around 100 Ohms. The disadvantage of continuous current flow has been bypassed previously by reading the fuse conditions at chip reset and latching them into volatile logic, and then powering down the current source using active logic.

A related choice, which affects the requirements for detecting whether the fuse has be completely blown, is the way in which the fuse is blown. The conventional method for blowing fuses (whether poly, metal or zener) is by adding probe pads to each end of the fuse, and directly applying a voltage, through probes, to blow the appropriate fuses during probing. This need for probe pads adds significantly to the chip area. Another method is to "blow" the fuse using a laser during the electrical probe operation. This method has additional cost associated with combining a laser with the tester. Optimally, it would be desirable to be able to blow the fuses when the chip was in the package. This would provide for improved in-package voltage precision, using the same serial interface that was used for normal circuit operation.

Polysilicon Fuse Status Detection Circuit With Serial Interface Fusing

The present application discloses a polysilicon fuse programming and status detection circuit with zero operating current and higher reblow capability where filament regrowth occurs. This is achieved by using a feedback connection, where the output logic state which indicates a blown state is fed back to a pull-up transistor which constantly applies voltage to one end of the blown fuse. Thus if regrowth occurs the fuse will be reblown. At the same time, the logic state of the fuse is always directly available as a logic level, without any special requirements for latching and powering down the fuse-reading circuitry. The circuit provides in one embodiment, for example, a pair of transistors which are both used to provide current through the fuse during blowing. In this embodiment control of one transistor controls both, so that when the signal to blow the fuse is removed, both circuits are turned off (unless filament regrowth occurs, and then one of the transistors automatically turns on and reblows the filament). Some embodiments also disclose a serial interface fusing technique for blowing the fuse while the circuit is enclosed in packaging.

The disclosed inventions, in various embodiments, provide a zero operating current, static logic polysilicon fuse-state detector circuit, and solve the problems presented by conventional methods where excessive current is used in polysilicon fuse arrays, and false detections occur due to filament regrowth.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Innovative Fusing Circuit

Figure 1:
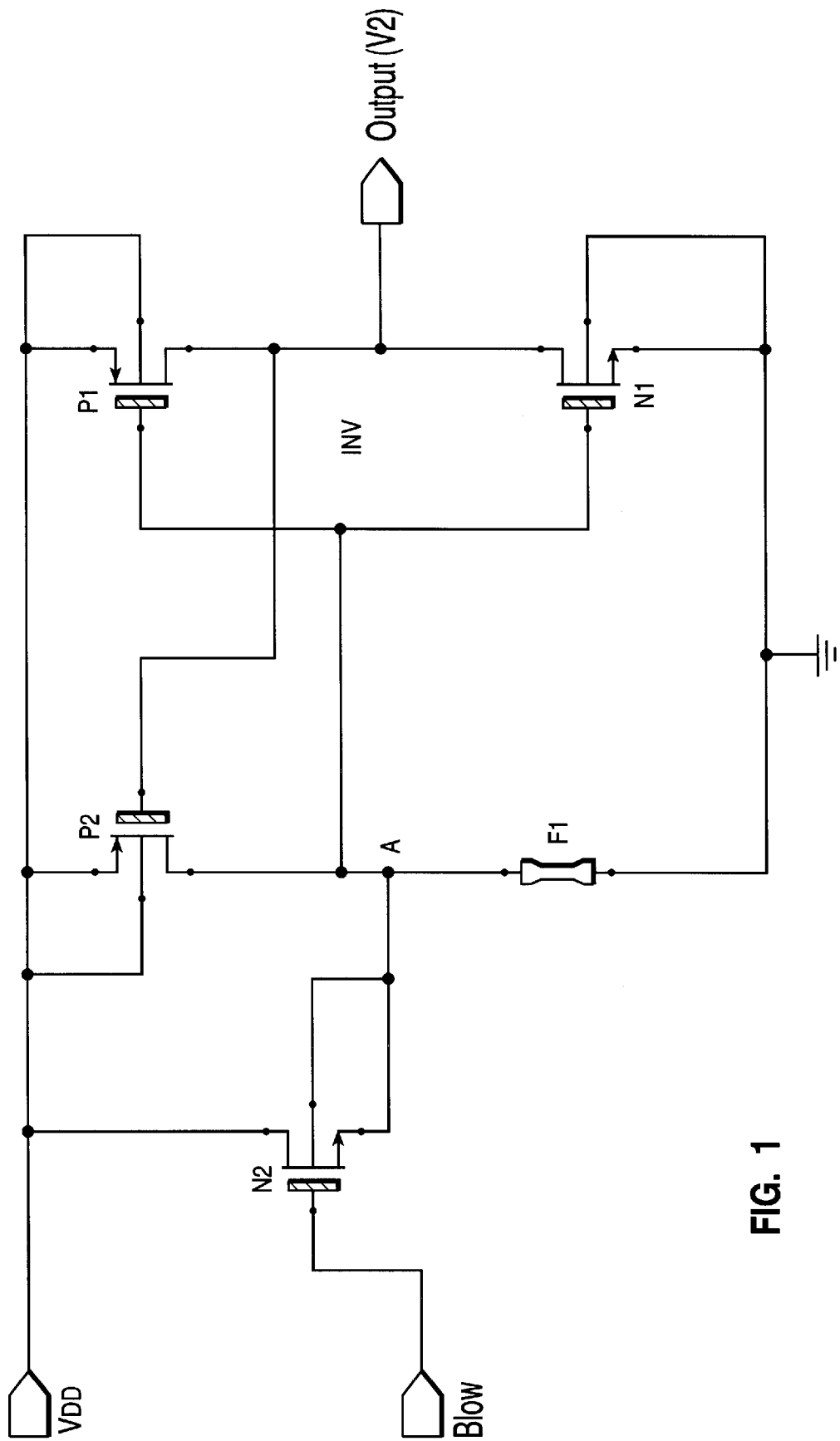
FIG. 1 shows a preferred embodiment of the fuse circuit.

FIG. 1 shows a preferred embodiment of the circuit using a fuse as the electrically blowable element. The circuit comprises a control circuit incorporating feedback from an output inverter circuit INV back to the "blow" transistors P2 and N2). Transistor N2 also provides the serial interface for the programming function of the circuit. In the circuit's pre-blown state, the voltage at Node A is at or near the ground voltage. Since the input of the inverter circuit INV is the voltage at Node A (at or near ground voltage), PMOS transistor P1 is ON and NMOS transistor N1 is OFF (and does not pass any current). With its input low, the output voltage V2 of the inverter circuit INV rises to a high state (approximately $V_{DD}$=5V). Additionally, since the gate of PMOS transistor P2 is also connected to the inverter output V2, transistor P2 is OFF. Essentially, no current passes through the fuse F1. In this respect, the circuit is current-free in this operating mode, and the signal at the output of the inverter V2 can be monitored to ascertain that the fuse is unblown.

When the fuse F1 is to be blown, the gate of NMOS transistor N2 goes high (i.e. receives a BLOW signal). The voltage at Node A rises, turning transistor P1 OFF and N1

ON. The output V2 then goes low, turning on transistor P2 which conducts current from source $V_{DD}$ through the fuse F1. The fuse F1 is then blown and the voltage at Node A rises to $V_{DD}$. The circuit operates in a "hysteretic" fashion by not returning to its original state prior to receiving the BLOW command. When the BLOW signal is received, the inverter stage INV feeds the output voltage V2 back to control the operation of transistor P2. An advantage is that this circuit has a higher current re-blow capability for instances of partial filament regrowth. (Even a small device such as transistor P2 can pull hundreds of microamperes when shorted to ground.) Any unwanted filament regrowth of the fuse F1 will be automatically re-blown, rather than possibly causing a false logic output. Any further filament growth is automatically eliminated by current drawn through transistor P2. However, current is only drawn when filament regrowth occurs. Therefore, the circuit is also current-free in this operating mode.

Another advantage is that the circuit is self-contained and doesn't rely on digitally-switched current sources. Current flow only occurs "on-demand" when a bridging occurs during, for example, filament regrowth.

The fuse circuit was developed for use with a Texas Instruments 50 bp21 process, which is used for power IC applications, but is applicable -to -all processes with polysilicon, metal or zener fuse configurations. The NMOS devices are low voltage LDMOS with a width of 40. The PMOS are 50V drain-extended devices with an approximate width of 55. The Schottky has an area of 144 square microns. The poly-resistor has a pre-fused value of about 100 Ohms.

Incorporated into this disclosure are two other "already used" innovations: the 'blow' transistor N2 which may be used with a serial interface can also be used, and a Schottky diode, which can also be incorporated for protection of the circuitry during the fusing process. An advantage is that the disclosed technique provides a simple application to other non-volatile fuse schemes. For example, the same circuit can readily be converted to a zero-current fuse-state detector for zeners and metal fuses.

Alternative Embodiment: Fuse Replaced by Zener Diode

Figure 5:
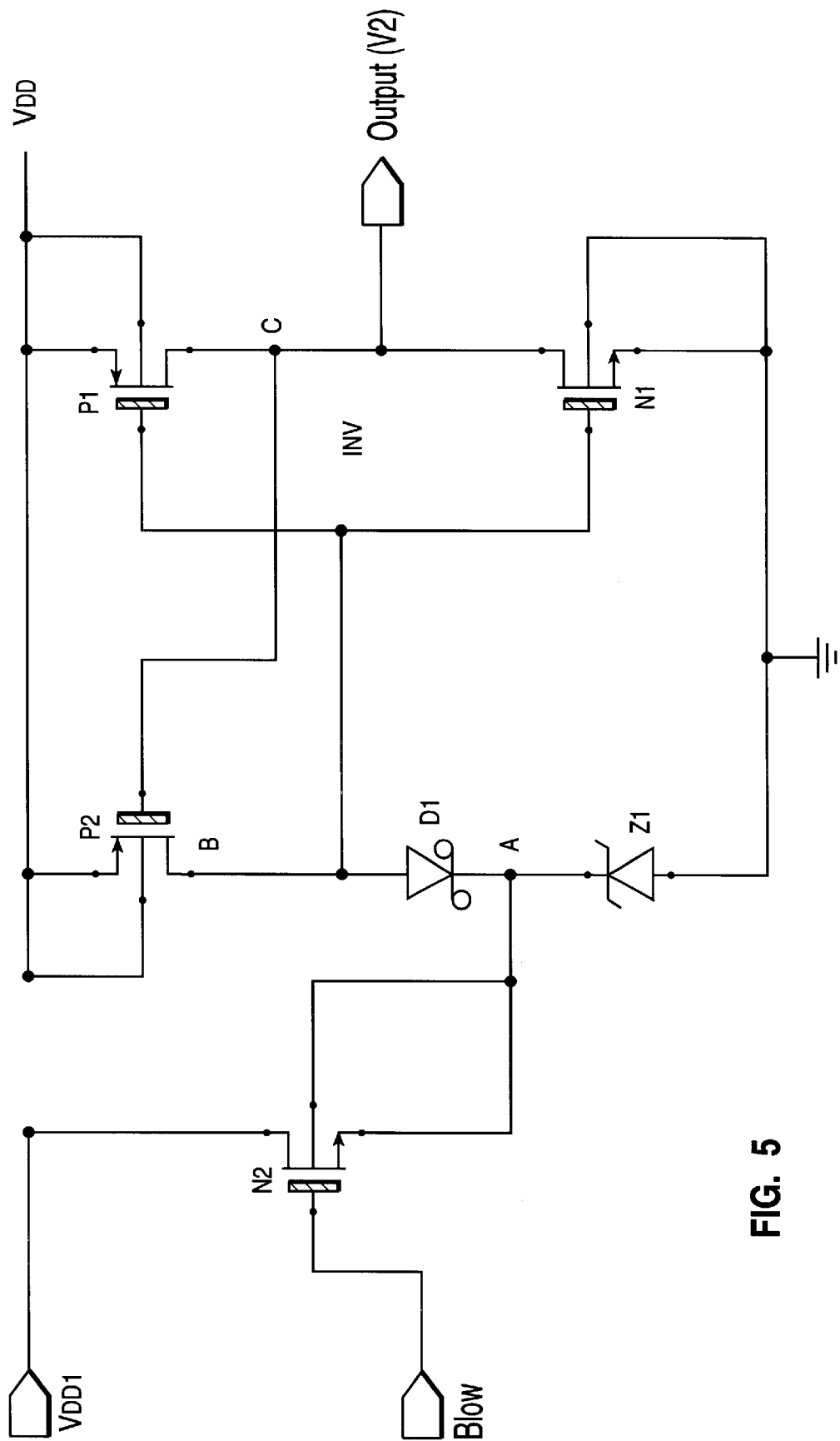
FIG. 5 shows an alternative embodiment where a zener diode is used in place of the fuse.

FIG. 5 shows an alternative embodiment where a zener diode is used as the electrically blowable element. In the unblown case, the zener Z1 presents a high impedance up to, for example, 6.5V. Therefore, Node B voltage will be at or near $V_{DD}$, and Node C will be at or near zero volts, therefore no current flows. If the zener Z1 is fused (by passing current through transistor N2, when $V_{DD1}$ is approximately >6.5 volts), the voltage at Node A will be at zero volts, and the voltage at Node B will be close to zero volts. The voltage at Node C will approximate $V_{DD}$, turning off transistor P2. Again, no current will flow.

Alternative Embodiment: Diode in the Current Path

Figure 6:
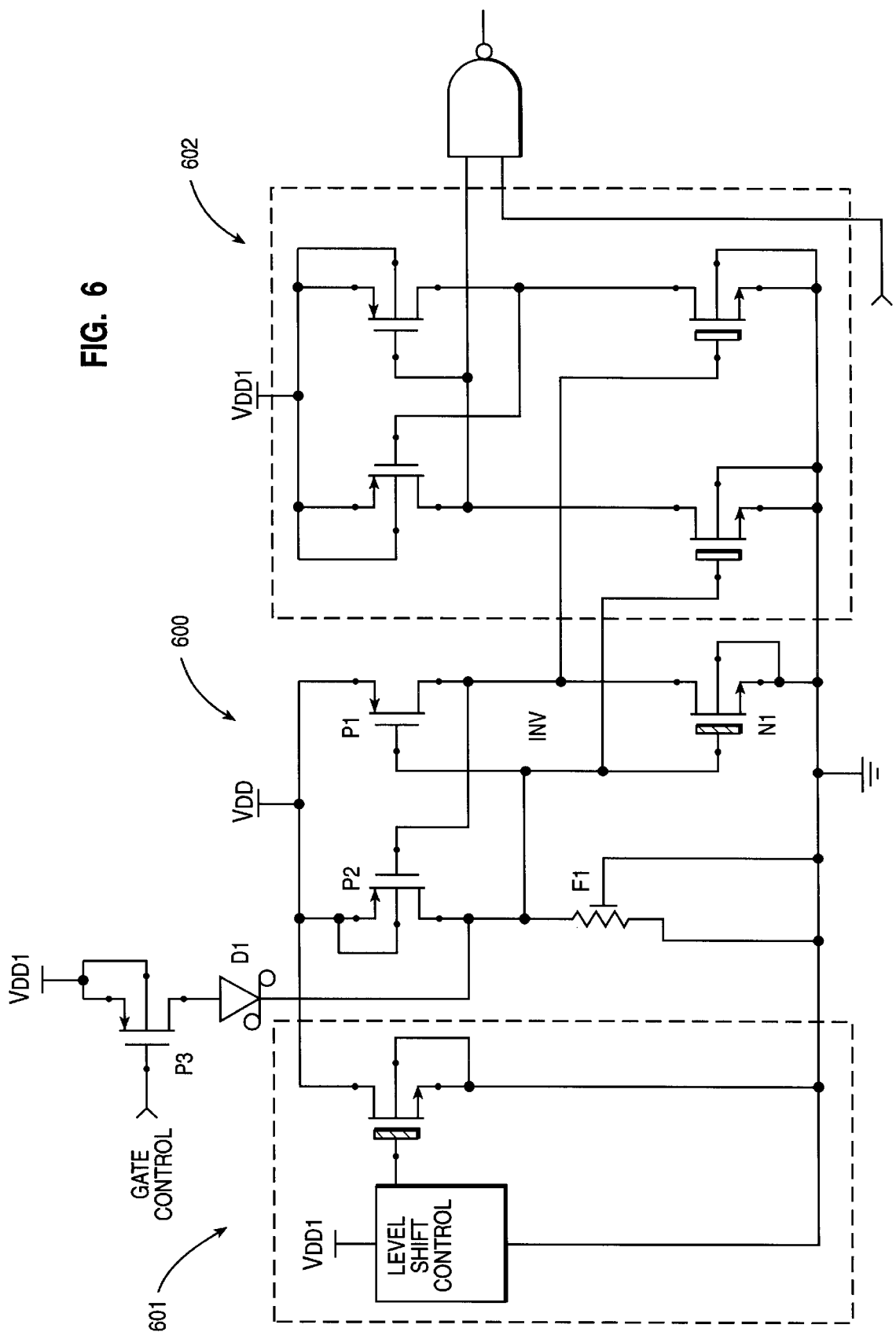
FIG. 6 shows an alternative embodiment with logic pre-drive and a conventional level-shifter circuit.

FIG. 6 shows an alternative embodiment with logic pre-rive and a conventional level-shifter circuit. The circuit comprises a logic pre-drive section 601 for controlling the fuse control circuit 600. Following the fuse control circuit 600 is a level-shifter circuit 602 for translating one set of voltage levels to another level which is compatible with downstream circuitry. In this particular embodiment, the blocking diode D1 has been placed (optionally) in the current path for the fusing operation. This means that the device size for diode D1 may need to be larger than, for example, the diode D1 of FIG. 2. However, as a result, the circuit itself may than operate at a slightly lower voltage level. Transistor P3 provides the initial blow current through diode D1 to fuse F1. Follow-up filament regrowth control is provided by transistor P2. Approximate device sizes for this circuit are the following: 50 volt drain-extended devices, P1 and P2—58.6/2.8; P3—1.2/50; a low-voltage LDMOS N1—40/1.5; D1—144 square microns; and a fuse pre-blow resistance of approximately 100 ohms.

Alternative Embodiment: Schottky Diode

Figure 2:
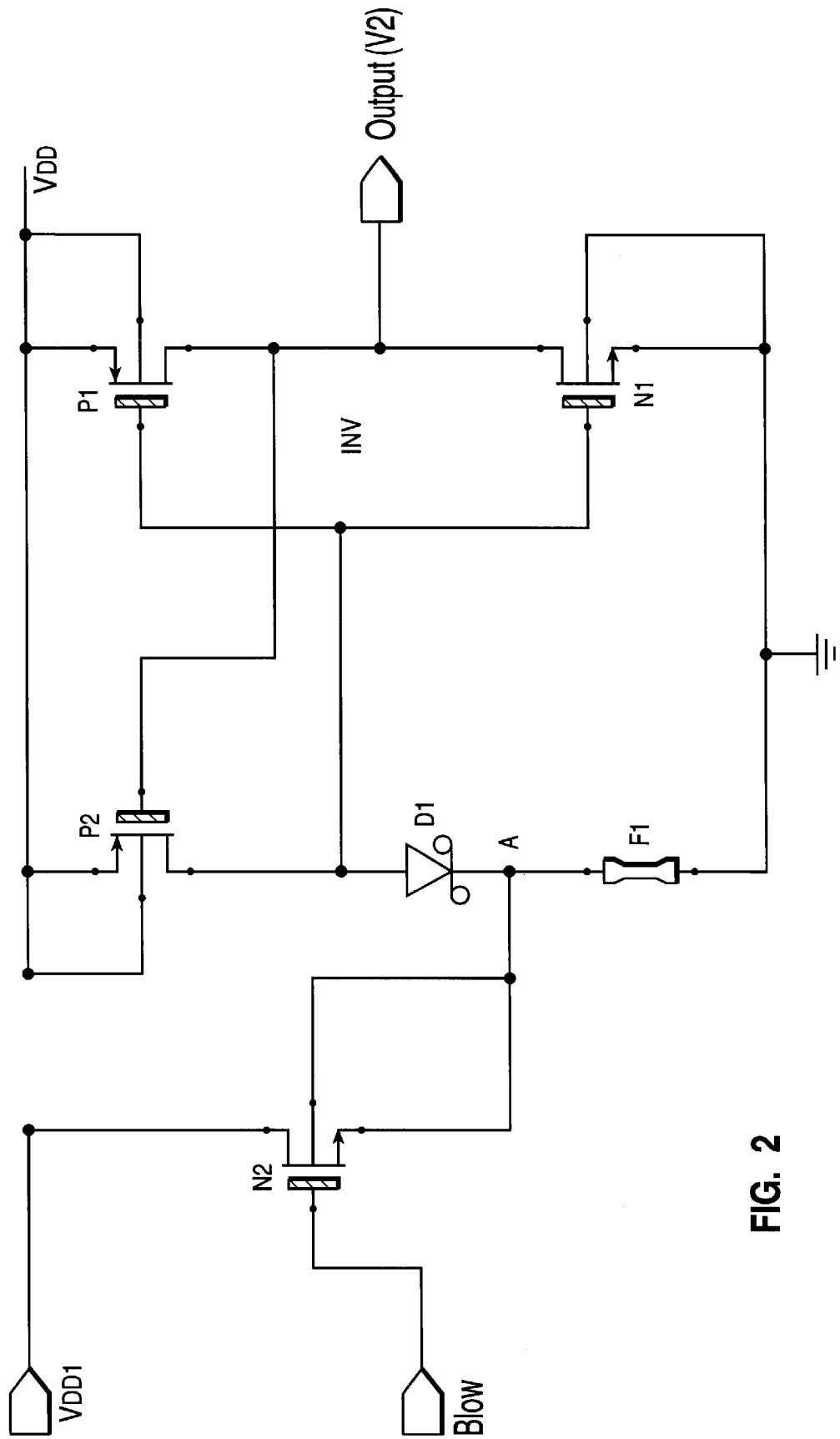
FIG. 2 shows an alternative embodiment using a Schottky diode.

FIG. 2 shows an alternative embodiment using the Schottky diode. The circuit for this implementation is identical to the circuit of FIG. 1, with the exception of adding a Schottky diode D1, and also providing a supply voltage $V_{DD1}$ different than $V_{DD}$ to the drain of transistor N2 (e.g. $V_{DD1}$ has greater current capacity than $V_{DD}$). In this implementation, the Schottky diode D1 prevents damage to other areas of the circuit when an independent voltage $V_{DD1}$ is used to blow fuse F1.

Alternative Embodiment: Inverted Logic

Figure 3:
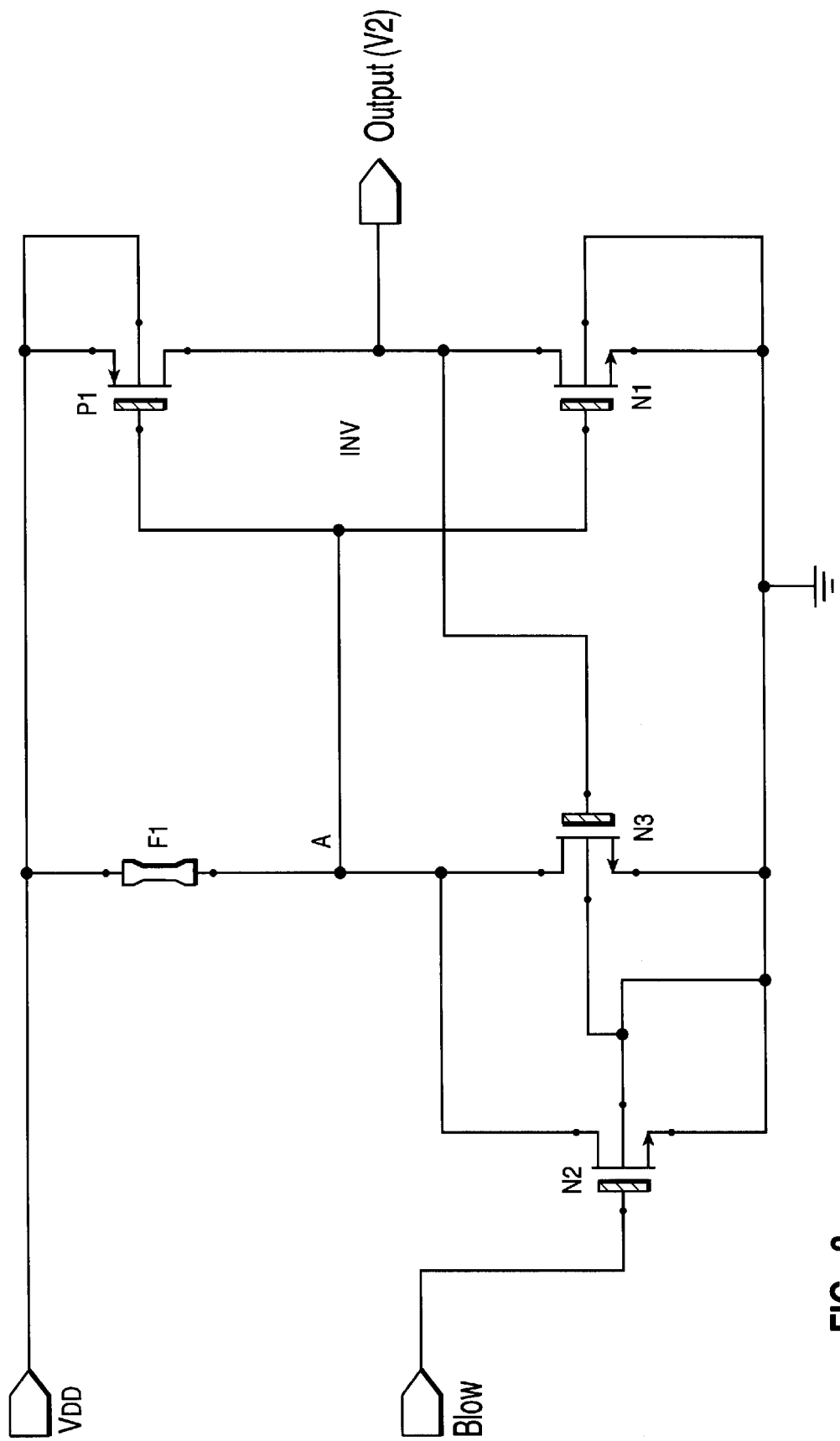
FIG. 3 shows an alternative embodiment using inverted logic.
Figure 4:
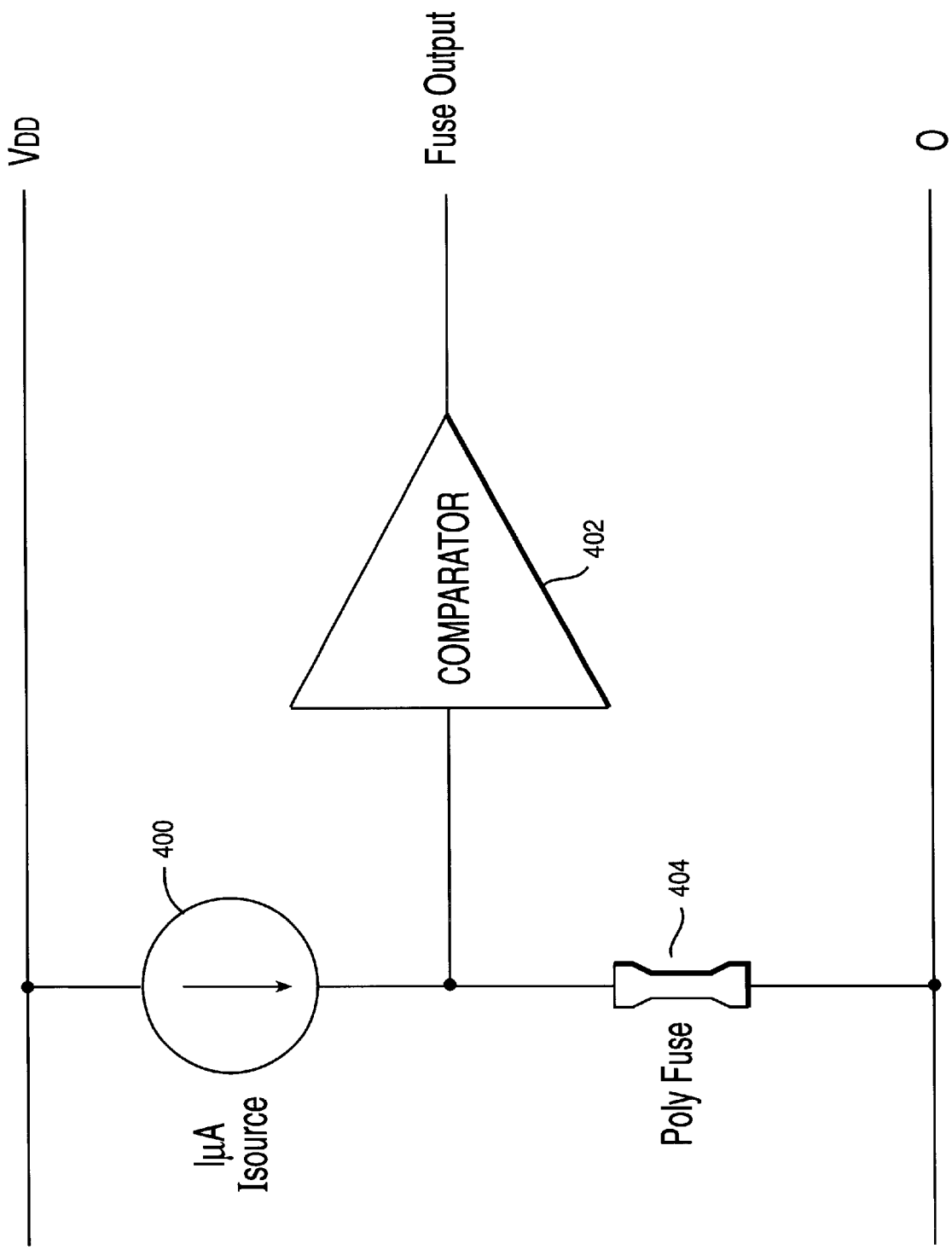
FIG. 4 shows a prior-art polysilicon fuse circuit.

FIG. 3 shows an alternative embodiment using the inverted logic. This circuit is identical to the circuit of FIG. 1, except where the circuit of FIG. 1 used transistor P2 as a p-channel device, this circuit employs an n-channel device N3. The gate of transistor N3 is connected to the inverter output V2. In the pre-blown state, the voltage at Node A is at or near the source voltage $V_{DD}$. The input to the inverter INV is at a high level (e.g. the source voltage) which drives the inverter output V2 to a low state. A low state at the inverter output V2 keeps transistor N3 OFF.

When the fuse F1 is to blown, a BLOW signal is received at the gate of transistor N2, which turns transistor N2 ON. The voltage at Node A is pulled low, and current through fuse F1 is sufficient to blow the fuse F1. Furthermore, a low voltage at Node A generates a high state at the inverter output V2 which turns transistor N3 ON. This allows more current to be drawn through the fuse F1 to help prevent filament regrowth.

According to a disclosed class of innovative embodiments, there is provided: An electrically blowable element programming and status detection circuit, comprising: a electrically blowable element; and a feedback control circuit for applying current to said electrically blowable element, and holding said electrically blowable element in a blown state.

According to another disclosed class of innovative embodiments, there is provided: An electrically blowable element programming and status detection circuit, comprising: a electrically blowable element; and a feedback control circuit for applying current to said electrically blowable element, and comprising at least first and second active elements operatively connected to said electrically blowable element to apply current to said electrically blowable element; and an inverter circuit connected to provide feedback to said first active element, and comprising an output for status detection of said electrically blowable element; wherein said detection circuit is substantially current-free until filament regrowth occurs, at which time said feedback control circuit automatically re-blows said electrically blowable element.

According to another disclosed class of innovative embodiments, there is provided: An integrated circuit for programming and detecting the status of an electrically blowable element while the electrically blowable element is encased within the packaging, comprising: at least one electrically blowable element; and a feedback control circuit operatively connected to said electrically blowable element to apply current to said electrically blowable element, said feedback control circuit comprising at least one active element operatively connected to said feedback control circuit, said active element connected to provide a serial interface to said feedback control circuit, and for receiving a blow signal.

According to another disclosed class of innovative embodiments, there is provided: A method for programming and detecting an integrated electrically blowable element, comprising the steps of: (a.) activating a feedback control circuit to apply current to a electrically blowable element; and (b.) holding said electrically blowable element in a blown state using said feedback control circuit.

According to another disclosed class of innovative embodiments, there is provided: An electrically blowable element control and detection method, comprising the steps of: (a.) controlling an electrically blowable element with at least first and second active elements operatively connected to switch current through said electrically blowable element, said current being substantial enough to blow said electrically blowable element; (b.) automatically re-blowing said electrically blowable element when filament regrowth has occurred; and (c.) detecting the status of said electrically blowable element.

According to another disclosed class of innovative embodiments, there is provided: A method for programming and detecting an integrated electrically blowable element while the electrically blowable element is encased within the packaging, comprising the steps of: (a.) providing an electrically blowable element operatively connected serial interface to a feedback control circuit; (b.) switching current through said electrically blowable element to blow said electrically blowable element with said feedback control circuit, and automatically reapplying said current if filament regrowth appears in said electrically blowable element; and (c.) detecting the status of said electrically blowable element.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

According to a disclosed class of innovative embodiments, if an alternative threshold voltage is desirable for the inverter composed of transistors P2/N2, the devices may be sized accordingly.

According to a another disclosed class of innovative embodiments, any diode that is completely isolatable from the substrate could be used in place of the Schottky (e.g. a vertical NPN, base-collector connected).

According to another disclosed class of innovative embodiments, the NMOS devices may be replaced with DMOS devices.

What is claimed is:

1. An electrically blowable element programming and status detection circuit, comprising:
   an electrically blowable element; and
   a feedback control circuit responsive to a voltage applied to said electrically blowable element for selectively applying current to said electrically blowable element, and holding said electrically blowable element in a blown state;
   wherein, in said feedback control circuit, a diode is interposed in the current path from a first transistor to said electrically blowable element, said first transistor being a PMOS transistor.

2. The integrated circuit of claim 1, wherein said electrically blowable element is a polysilicon fuse, metal fuse, or a zener diode.

3. The integrated circuit of claim 1, wherein said feedback control circuit operates in a hysteretic fashion by not returning to its preblown state.

4. The integrated circuit of claim 1, wherein said feedback control circuit comprises at least first and second transistors for applying said current to said electrically blowable element, and an inverter circuit for controlling said first transistor, said first transistor being a PMOS transistor, and said second transistor being an NMOS transistor.

5. The integrated circuit of claim 1, wherein said feedback control circuit comprises at least first and second transistors for applying said current to said electrically blowable element, and wherein both said first and second transistors are NMOS transistors.

6. The integrated circuit of claim 1, wherein said feedback control circuit uses two independent supply voltages.

7. An electrically blowable element programming and status detection circuit, comprising:
   a electrically blowable element; and
   a feedback control circuit for applying current to said electrically blowable element, and comprising
      at least first and second active elements operatively connected to said electrically blowable element to apply current to said electrically blowable element; and
      an inverter circuit connected to provide feedback to said first active element, and comprising an output for status detection of said electrically blowable element;
   wherein, in said feedback control circuit, a diode is placed in the current path from said first active element to said electrically blowable element, said first active element being a PMOS transistor.

8. The integrated circuit of claim 7, wherein said electrically blowable element is a polysilicon fuse, metal fuse, or a zener diode.

9. The integrated circuit of claim 7, wherein said feedback control circuit operates in a hysteretic fashion by not returning to its preblown state.

10. The integrated circuit of claim 7, wherein said first active element is a PMOS transistor, and said second active element is an NMOS transistor.

11. The integrated circuit of claim 7, wherein said first and second active elements are NMOS transistors.

12. The integrated circuit of claim 7, wherein both said first and second active elements are PMOS transistors.

13. An electrically blowable element programming and status detection circuit, comprising:
   a electrically blowable element; and
   a feedback control circuit for applying current to said electrically blowable element, and comprising
      at least first and second active elements operatively connected to said electrically blowable element to apply current to said electrically blowable element; and
      an inverter circuit connected to provide feedback to said first active element, and comprising an output for status detection of said electrically blowable element;

wherein said feedback control circuit uses two independent supply voltages.

14. An integrated circuit for programming and detecting the status of an electrically blowable element while the electrically blowable element is encased within packaging; comprising:

at least one electrically blowable element; and a feedback control circuit operatively connected to said electrically blowable element to apply current to said at least one electrically blowable element, said feedback control circuit comprising first and second active elements, said first active element connected to provide a serial interface to said feedback control circuit, and for applying current to said at least one electrically blowable element in response to a blow signal, said second active element responsive to a voltage applied to said at least one electrically blowable element for selectively applying current to said electrically blowable element and holding said electrically blowable element in a blown state;

wherein, in said feedback control circuit, a diode is interposed in the current path from a second active element to said electrically blowable element, said second active element being a PMOS transistor which receives a supply different from a supply voltage of said feedback control circuit.

15. The integrated circuit of claim 14, wherein said electrically blowable element is a polysilicon fuse, metal fuse, or a zener diode.

16. The integrated circuit of claim 14, wherein said active element is a NMOS transistor.

17. The integrated circuit of claim 14, wherein said feedback control circuit operates in a hysteretic fashion by not returning to its preblown state.

18. The integrated circuit of claim 14, wherein said feedback control circuit uses two independent supply voltages.

* * * * *